(12) United States Patent
Pourghaderi et al.

(10) Patent No.: US 9,093,516 B2
(45) Date of Patent: Jul. 28, 2015

(54) SEMICONDUCTOR HETEROSTRUCTURE FIELD EFFECT TRANSISTOR AND METHOD FOR MAKING THEREOF

(71) Applicant: IMEC, Leuven (BE)

(72) Inventors: Mohammad Ali Pourghaderi, Leuven (BE); Bart Soree, Begijnendijk (BE)

(73) Assignee: IMEC, Leuven (BE)

( * ) Notice: Subject to any disclaimer, the term of this patent is extended or adjusted under 35 U.S.C. 154(b) by 17 days.

(21) Appl. No.: 14/089,613

(22) Filed: Nov. 25, 2013

(65) Prior Publication Data

US 2014/0158985 A1    Jun. 12, 2014

Related U.S. Application Data

(60) Provisional application No. 61/734,854, filed on Dec. 7, 2012.

(30) Foreign Application Priority Data

Feb. 19, 2013   (EP) ..................................... 13155745

(51) Int. Cl.
  *H01L 31/0336*   (2006.01)
  *H01L 29/78*   (2006.01)
  *H01L 29/66*   (2006.01)
  (Continued)

(52) U.S. Cl.
  CPC .............. *H01L 29/78* (2013.01); *H01L 29/068* (2013.01); *H01L 29/66431* (2013.01); *H01L 29/66462* (2013.01); *H01L 29/66977* (2013.01); *H01L 29/7781* (2013.01); *H01L 29/205* (2013.01)

(58) Field of Classification Search
  CPC .............. H01L 29/78; H01L 29/66977; H01L 29/66431; H01L 29/7781; H01L 29/068; H01L 29/66462; H01L 29/205
  USPC ............ 257/24, 190–192, 296, 349, 368, 903
  See application file for complete search history.

(56) References Cited

U.S. PATENT DOCUMENTS 6,888,181 B1    5/2005  Liao et al.
2002/0011628 A1    1/2002  Takagi
(Continued)

OTHER PUBLICATIONS

Fahad et al., "Silicon Nanotube Field Effect Transistor with Core-Shell Gate Stacks for Enhanced High-Performance Operation and Area Scaling Benefits" Nano Lett.11, 4393-4399 (2011).
(Continued)

*Primary Examiner* — Dung Le
(74) *Attorney, Agent, or Firm* — Knobbe Martens Olson & Bear, LLP

(57) ABSTRACT

A heterostructure field effect transistor is provided comprising a semiconductor wire comprising in its longitudinal direction a source and a drain region, a channel region in between the source and drain region and in its transversal direction for the source region, a source core region and a source shell region disposed around the source core region, the source shell region having in its transversal direction for the drain region, a drain core region and a drain shell region disposed around the drain core region, the drain shell region having in its transversal direction for the channel region, a channel core region and a channel shell region disposed around the channel core region; wherein the thickness of the channel shell region is smaller than the thickness of the source shell region and is smaller than the thickness of the drain shell region.

14 Claims, 9 Drawing Sheets

(51) Int. Cl.
*H01L 29/778* (2006.01)
*H01L 29/06* (2006.01)
*H01L 29/205* (2006.01)

(56) References Cited

U.S. PATENT DOCUMENTS

| | | |
|---|---|---|
| 2004/0145019 A1 | 7/2004 | Dakshina-Murthy et al. |
| 2005/0017377 A1 | 1/2005 | Joshi et al. |
| 2005/0218438 A1 | 10/2005 | Lindert et al. |
| 2006/0292776 A1 | 12/2006 | Jin et al. |
| 2007/0114530 A1* | 5/2007 | Kimura .................. 257/59 |
| 2008/0191196 A1 | 8/2008 | Lu et al. |
| 2008/0237577 A1 | 10/2008 | Chui et al. |
| 2009/0001415 A1 | 1/2009 | Lindert et al. |
| 2011/0024794 A1 | 2/2011 | Ko et al. |
| 2011/0156004 A1 | 6/2011 | Radosavljevic et al. |

OTHER PUBLICATIONS

He et al., "GaAs—GaP Core-Shell Nanowire Transistors: A Computational Study", 9th International Conference on Solid-State and Integrated-Circuit Technology, 2008. ICSICT 2008., Publication Year: 2008, pp. 385-388.

Lauhon et al., "Epitaxial core-shell and core-multishell nanowire heterostructures", Nature: International Weekly Journal of Science, vol. 420, Nov. 7, 2002, pp. 57-61.

Nah et al., "Ge—$Si_xGe1$—$x$ Core—Shell Nanowire Tunneling Field-Effect Transistors", IEEE Transactions on Electron Devices, vol. 57, No. 8, Aug. 2010.

Nah et al., "Scaling Properties of Ge—$Si_xGe1$—$x$ Core-Shell Nanowire Field Effect Transistors", IEEE Transactions on Electron Devices 57, pp. 491-495 (2010).

Tomioka et al., "Vertical $In_{0.7}Ga_{0.3}As$ nanowire surrounding-gate transistors with high-k gate dielectric on Si substrate", Electron. Devices Meeting (IEDM), 2011 IEEE International, Dec. 5, 2011, pp. 33.3.1-33.3.5.

Lu et al., "Nanowire Transistor Performance Limits and Applications" IEEE Transactions on Electron Devices, vol. 55, No. 11, Nov. 2008.

* cited by examiner

SEMICONDUCTOR HETEROSTRUCTURE FIELD EFFECT TRANSISTOR AND METHOD FOR MAKING THEREOF

INCORPORATION BY REFERENCE TO RELATED APPLICATIONS

Any and all priority claims identified in the Application Data Sheet, or any correction thereto, are hereby incorporated by reference under 37 CFR 1.57. This application claims the benefit of U.S. Application No. 61/734,854 filed Dec. 7, 2012 and European Application No. EP 13155745.6 filed Feb. 19, 2013, the disclosures of which are hereby expressly incorporated by reference in their entirety and are hereby expressly made a portion of this application.

FIELD OF THE INVENTION

Semiconductor heterostructure field effect transistors are provided, more specifically semiconductor nanowire heterostructure field effect transistors. Also provided is a method for making such transistors.

BACKGROUND OF THE INVENTION

The continuous trend of downscaling for complementary-metal-oxide-semiconductor (CMOS) technology is a great challenge and is driving industry to new and alternative architectures which should be able to address the difficult questions of voltage scaling, short channel effects, increasing power consumption, mobility, and the like.

A possible alternative to planar, one-dimensional (1D) CMOS technology is the introduction a two-dimensional (2D) and even three-dimensional (3D) CMOS technology such as for example the introduction of nanowire field effect transistors (NW-FET). In IEEE Transactions on Electron. Devices, Vol. 55, no. 11, November 2008, p. 2859-2976, limitations and applications are disclosed for NW-FETs.

SUMMARY OF THE INVENTION

Embodiments are related to a heterostructure field effect transistor and a method for manufacturing a heterostructure field effect transistor.

Embodiments are more specifically related to a nanowire quantum well heterostructure field effect transistor and a method for manufacturing thereof.

A heterostructure field effect transistor comprising a semiconductor wire is provided. A longitudinal direction L and a transversal direction T may be defined for the semiconductor wire. The heterostructure field effect transistor comprises in its longitudinal direction L a source region, a drain region and a channel region in between the source and drain region. The source region of the heterostructure field effect transistor comprises in its transversal direction T a source core region and a source shell region disposed around the source core region, the source shell region having a thickness $t_1$.

The drain region of the heterostructure field effect transistor comprises in its transversal direction T a drain core region and a drain shell region disposed around the drain core region, the drain shell region having a thickness $t_3$. The channel region of the heterostructure field effect transistor comprises in its transversal direction T a channel core region and a channel shell region disposed around the channel core region; the channel shell region having a thickness $t_2$. The thickness $t_2$ of the channel shell region is smaller than the thickness $t_1$ of the source shell region and is smaller than the thickness $t_3$ of the drain shell region. The heterostructure field effect transistor further comprises a gate structure disposed around the channel region of the semiconductor wire, the gate structure comprising a gate dielectric layer disposed around and in contact with the channel region and a gate layer disposed around and in contact with the gate dielectric layer.

According to certain embodiments, "disposed around" means "disposed around circumferentially".

According to certain embodiments, the source shell region, the drain shell region and the channel shell region are quantum well regions.

According to certain embodiments, thickness $t_2$ is such that sub band quantization in the channel shell region is substantially significant. With substantially significant is meant that the channel shell region has a sub-band quantization energy greater than 4 kT. This can be determined by for instance running a simulation wherein the thickness $t_2$, the material used, the doping level of this material and the bias voltage are taken into account.

According to certain embodiments, the shell region (defined by the source shell region, channel shell region and drain shell region) and core region (defined by the source core region, channel core region and drain core region) comprise lattice matched materials. The core region may comprise InP or $In_xAl_yAs$ (wherein x+y=1; x is typically from 30 to 70, preferably from 40 to 64, more preferably from 46 to 58, yet more preferably from 50 to 54, for instance 52). The shell region may comprise $In_xGa_yAs$ (wherein x+y=1; x is typically from 30 to 70, preferably from 41 to 65, more preferably from 47 to 59, yet more preferably from 51 to 55, for instance 53).

A method is provided for manufacturing a heterostructure field effect transistor comprising the steps of providing a semiconductor core region comprising a channel core region located in between a source core region and a drain core region, wherein the thickness of the source core region and the drain core region is smaller than the thickness of the channel core region; providing a semiconductor shell region around and in contact with the core region, the semiconductor shell region comprising a channel shell region located in between a source shell region and a drain shell region; providing a gate structure comprising the steps of providing a gate dielectric layer around and in contact with the channel shell region and providing a gate layer disposed around and in contact with the gate dielectric layer.

According to certain embodiments, providing a semiconductor core region comprises providing a uniform semiconductor core material (i.e. a semiconductor core material of uniform thickness) and etching part of the semiconductor core material at the source core region and drain core region.

According to certain embodiments, providing a semiconductor core region comprises providing a uniform semiconductor core material; providing a hard mask layer on the uniform semiconductor core material at the source core region and drain core region; providing the semiconductor core material on the parts of the core region which are unmasked.

According to certain embodiments, providing a semiconductor shell region comprises providing a first layer of semiconductor shell material comprising a shell material around and in contact with the core region; the first layer of semiconductor shell material having a thickness $t_2$; after the step of providing a gate structure, providing a remainder part of the semiconductor shell layer comprising the shell material around and in contact with the core region; the remainder part of the semiconductor shell layer having a thickness $t_4$.

According to certain embodiments the core material and shell material are lattice matched. The core material may comprise InP or $In_xAl_yAs$. The shell material may comprise $In_xGa_yAs$. Thickness $t_2$ is smaller than $t_1$ and is smaller than $t_3$. In embodiments, $t_2$ may be comprised between $(t_1+t_3)/8$ and $(t_1+t_3)/4$. In embodiments, thickness $t_2$ may be smaller than 15 nm, 10 nm or 4 nm. Thickness $t_2$ is preferably smaller than 4 nm.

It is an advantage of certain embodiments that the intrinsic electrostatics is enhanced compared to conventional quantum well structure.

By enhanced intrinsic electrostatics, it is meant that the core shell structure with tuned thickness for channel area will offer better gate control over the channel.

It is an advantage of certain embodiments that the mobility of the device according to certain embodiments is enhanced compared to conventional quantum well transistors.

It is an advantage of certain embodiments that downscaling of the device is possible with only small short channel effect or without suffering from short channel effects.

It is an advantage certain embodiments that an easy manufacturable and cost-effective scaled device is proposed.

BRIEF DESCRIPTION OF THE DRAWINGS

The disclosure will be further elucidated by means of the following description and the appended figures.

DETAILED DESCRIPTION OF THE EMBODIMENTS

Figure 1:
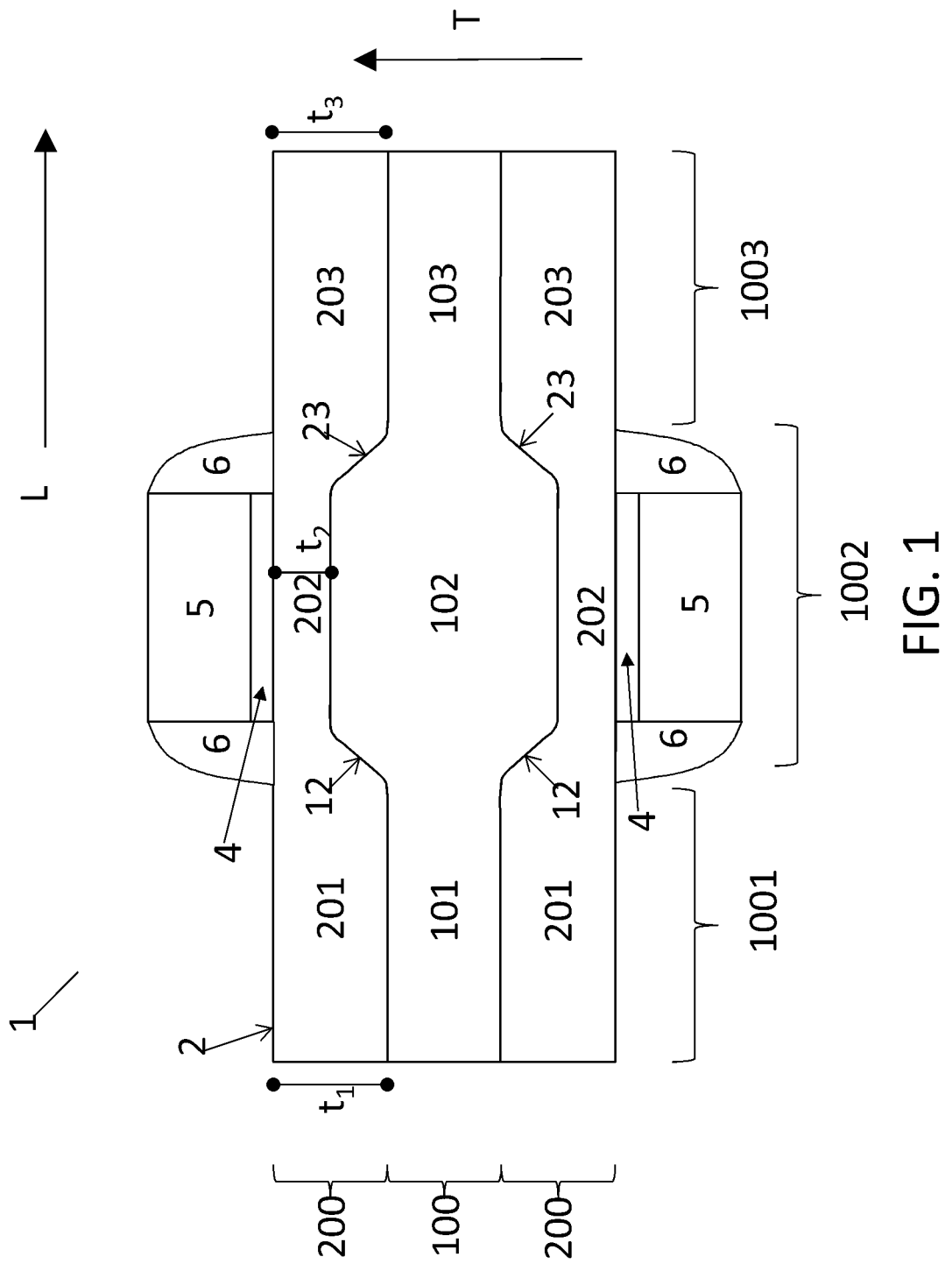
FIG. 1 illustrates a schematic representation of a heterostructure field effect transistor (FET) according to an embodiment.

The disclosure will be further elucidated by means of the following description and the appended figures.

In the following detailed description, numerous specific details are set forth in order to provide a thorough understanding of the disclosure and how it may be practiced in particular embodiments. However, it will be understood that the present disclosure may be practiced without these specific details. In other instances, well-known methods, procedures and techniques have not been described in detail, so as not to obscure the present disclosure. While the present disclosure will be described with respect to particular embodiments and with reference to certain drawings, the disclosure is not limited hereto. The drawings included and described herein are schematic and are not limiting the scope of the disclosure. It is also noted that in the drawings, the size of some elements may be exaggerated and, therefore, not drawn to scale for illustrative purposes.

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the disclosure.

Furthermore, the terms first, second, third and the like in the description and in the claims, are used for distinguishing between similar elements and not necessarily for describing a sequential or chronological order. The terms are interchangeable under appropriate circumstances and the embodiments of the disclosure can operate in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the disclosure described herein are capable of operation in other orientations than described or illustrated herein.

The term "comprising", used in the claims, should not be interpreted as being restricted to the means listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B.

The embodiments relate to a heterostructure field effect transistor (FET).

FIG. 1 shows a schematic representation of a heterostructure field effect transistor (FET) according to an embodiment.

The heterostructure FET 1 comprises a semiconductor wire 2.

A semiconductor wire 2 is defined as a semiconductor structure, having two different directions: a longitudinal direction L and a transversal direction T. In a semiconductor wire, transport of carriers typically takes place in the longitudinal direction L, wherein quantum confinement of the carriers typically takes place in the transversal direction T. The length of the semiconductor wire 2 (i.e. in the longitudinal direction L) is longer than the width or thickness or diameter of the semiconductor wire 2 (i.e. in the transversal direction T). The aspect ratio of the length to the width of a semiconductor wire 2 is typically in the order of 2:1 or more. For example for a 14 nm technology node, the gate length (longitudinal direction) is about 20 nm and confinement takes place in typically about 8 nm of width.

In the transversal direction T a cross-section of the semiconductor wire 2 may be defined. The cross-section of a semiconductor wire 2, more specifically a nanowire, may be of any arbitrary shape, including, but not limited to, circular, square, rectangular, annular, elliptical, and the like. The shape of the wire or nanowire may be a regular or irregular shape. If the shape is irregular, thicknesses $t_1$, $t_2$, $t_3$ and $t_4$ relate to the average thicknesses $t_1$, $t_2$, $t_3$ and $t_4$ respectively. The shape is preferably regular.

Whereas throughout the following, reference will be made to a circular semiconductor wire or nanowire, the embodiments are however not bound to this shape and a person skilled in the art may adapt to another shape such as for example a more rectangular shape.

In a preferred embodiment the semiconductor wire 2 is a semiconductor nanowire. A nanowire can be defined as a structure which has a thickness (or width or diameter) constrained to tens of nanometers or less (e.g. less than 100 nm) and an unconstrained length. As such they are often referred to as one-dimensional (1D) materials. Nanowires have many interesting properties that are not seen in bulk or 3D materials. This is because electrons in nanowires are quantum confined laterally and thus occupy only discrete energy levels that are different from the traditional continuum of energy levels or bands found in bulk materials.

The semiconductor wire 2 may comprise silicon, silicon germanium, III-V materials such as for example GaAs, GaP, InGaAs, InSb, InGaN, or the like.

The semiconductor wire 2 may be formed by techniques already known for a person skilled in the art such as for example chemical vapor deposition (CVD), vapor liquid-solid synthesis, etching or electrolysis.

Different regions of the semiconductor wire 2 are defined. In the longitudinal direction L three regions may be defined being a source region 1001, a drain region 1003 and a channel region 1002 located or sandwiched in between the source 1001 and drain 1003 region. In the transversal direction T for each of the above mentioned regions (source 1001, channel 1002 and drain 1003) again two regions may be defined being a core region 100 and a shell region 200 disposed (circumferentially) around the core region, more specifically being for the source region 1001 a source core region 101 and a source shell region 201, for the channel region 1002 a channel core region 102 and a channel shell region 202 and for the drain region 1003 a drain core region 103 and a drain shell region 203.

The channel shell region 202 has a thickness $t_2$, whereas the source and drain shell regions 201, 203 respectively have a thickness $t_1$ and $t_3$, for which both thickness $t_1$ and $t_3$ are larger than thickness $t_2$.

Thicknesses $t_1$, $t_2$ and $t_3$ may be defined in function of the technology node and thus in function of the scalability and design rules of the device. For example for a 10 nm technology node, thickness $t_2$ is preferably smaller than 4 nm. The upper limit of thickness $t_1$ and $t_3$ may be linked to the technology node. For example for a 10 nm technology node, thickness $t_1$ and $t_3$ will be smaller than 10 nm. The lower limit may be defined by series access resistance.

Depending on the channel material, thickness $t_2$ may be designed in a way that it entails considerable quantization in the channel area.

According to certain embodiments the source shell region 201, the drain shell region 203 and the channel shell region 202 may be quantum well regions. This means that quantization is possible. Quantum well regions are potential well regions, where quantum confinement is possible. The quantum confinement take place when the quantum well thickness becomes comparable to the de Broglie wavelength of the carriers (generally electrons and holes), leading to energy levels called "energy sub-bands", i.e., the carriers can only have discrete energy values. Thickness $t_2$ may thus be chosen such that sub band quantization in the channel shell region 202 is substantially significant. Thickness $t_2$ may be chosen such that the quantization level (which is defined as the difference between the energy level of a first sub band and the energy level of a second sub band) is greater than 4 kT, more preferably greater than 5 kT, even more preferably greater than 8 kT. Thinning down $t_2$ will open wider gap between quantization levels, which in turn will decrease interband scattering and enhance the mobility.

For example, in the case of $In_{0.53}Ga_{0.47}As$ thinning the $t_2$ down to 4 nm will single out the first subband and transport will take place within just one energy level.

Figure 7:
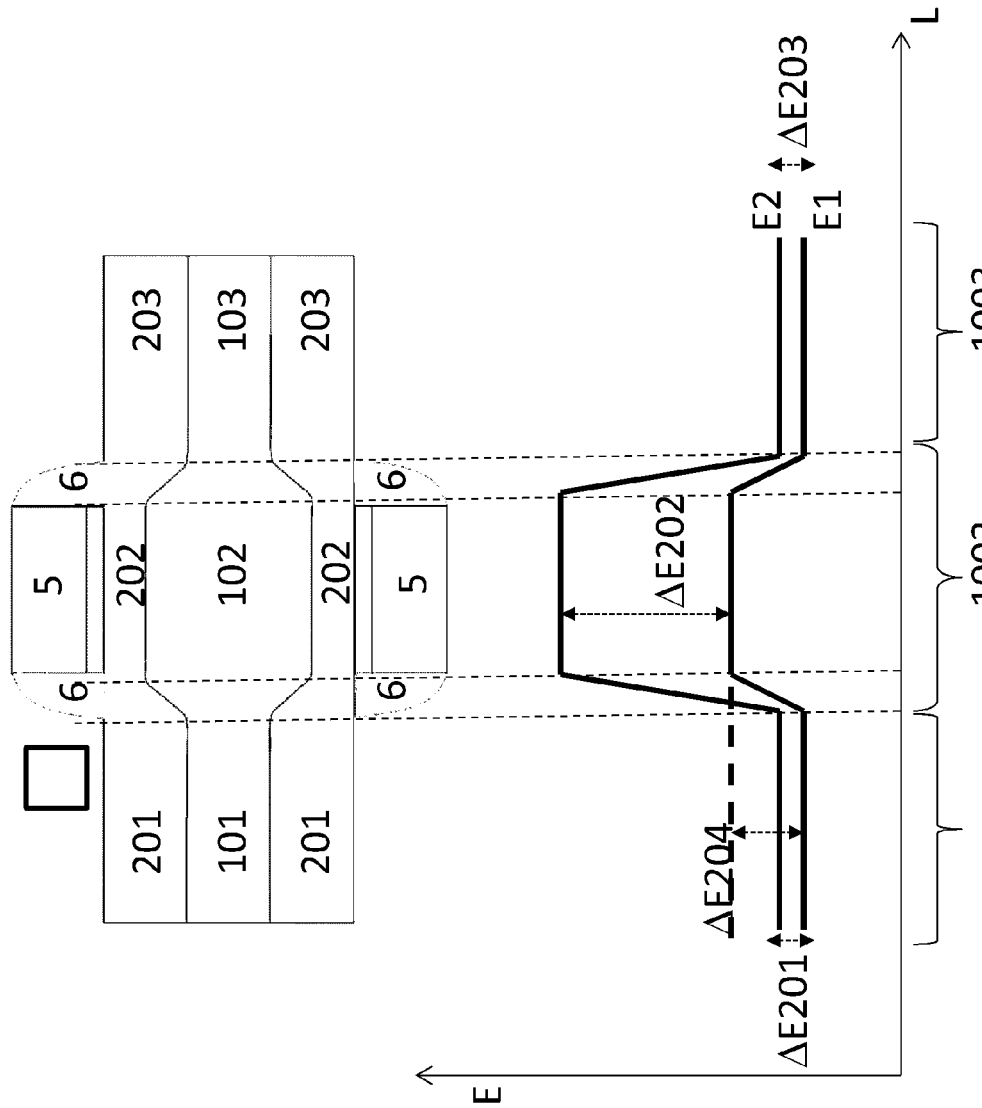
FIG. 7 illustrates schematically the physical effect of subband quantization for a heterostructure field effect transistor (FET) according to certain embodiments.

FIG. 7 shows schematically what is meant with sub band quantization. For each shell region, i.e. source shell region 201, channel shell region 202 and drain shell region 203 a first energy sub band E1 and a second energy sub band E2 is shown. The difference in energy between the first energy sub band E1 and the second energy sub band E2 is shown by $\Delta E201$, $\Delta E202$ and $\Delta E203$ for the source, channel and drain shell region (201, 202, 203) respectively. Preferably $\Delta E203$ and $\Delta E201$ will be the same as the thickness of these regions is preferably the same.

Due to the difference in thickness between the channel shell region and the source/drain shell region the difference in energy $\Delta E202$ in the channel shell region is much larger than the difference in energy $\Delta E201$, $\Delta E203$ in the source/drain shell region (1001, 1003). The larger difference in energy $\Delta E202$ in the channel shell region has the advantage that scattering of carriers is substantially reduced in the channel and as a consequence mobility is enhanced.

Figure 5:
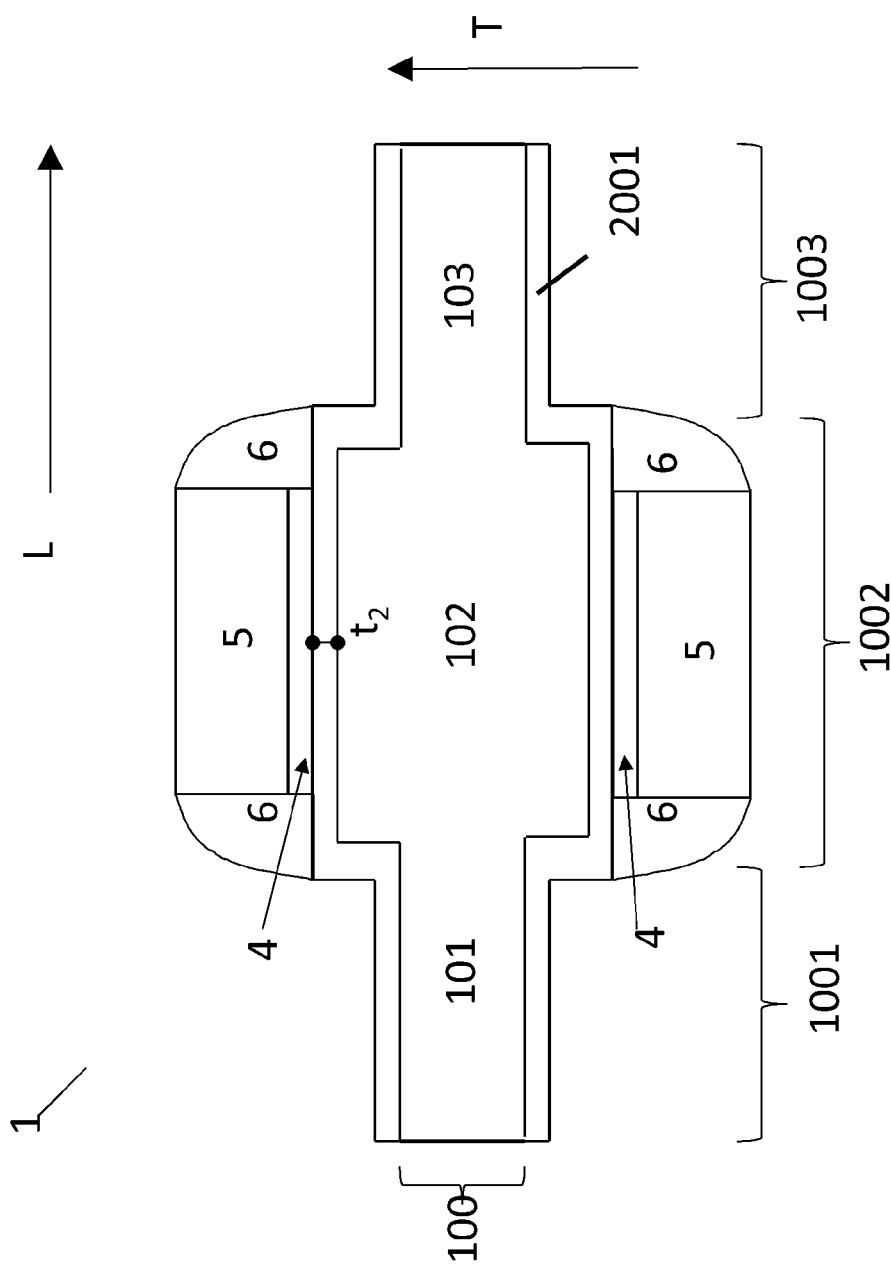
FIG. 5 illustrates a schematic representation of a second step of a method for manufacturing a shell of a heterostructure FET according to the embodiment illustrated in FIG. 4.

In the SC wire, the transition 12 between the source region and the channel region and the transition 23 between the channel region and the drain region may be sloped (as shown in FIG. 1). Ideally the transition is abrupt, otherwise said there is no slope (as shown in FIG. 5). The steeper the slope of transitions 12, 23 the better the scalability of the device. Depending on the manufacturing techniques used to form the semiconductor wire the transition may be made steeper or even in the ideal situation may be made abrupt.

By thinning the channel shell region to a certain thickness $t_2$, the gate control will be boosted and transconductance will increase. Due to the thicker extension regions (i.e. source shell region 201 and drain shell region 203) the series resistance remains controlled and thus does not increase (which would be the case when using a thin source/drain shell region). By modulating the thickness of the shell region, an extra barrier $\Delta E204$ is introduced in the quantum well region. This is due to the shift of the sub band energies along the device, which inversely follow the thickness profile of the (quantum well) shell regions. The height of the barrier $\Delta E201$, $\Delta E202$ and $\Delta E203$ is thus controlled by the ratio of thickness modulation $t_1$ versus $t_2$ and/or $t_1$ versus $t_3$. Due to the barrier height modulation the splitting of the sub band energy levels is higher in the channel shell region compared to in the source/drain shell region. This has the advantage that scattering of the carriers is reduced and as a consequence mobility of the carriers is enhanced.

Another possible contribution of extra quantum confinement in the gated area is for III-V materials where the extra quantum confinement will make carriers to migrate to so-called satellite valleys. These carriers have light effective mass in transport direction (longitudinal direction of the wire) and rather large effective mass in confinement direction (transversal direction of the wire), leading to a higher density of states.

According to embodiments the core regions and shell regions may comprise lattice matched materials. The core region may comprise $In_{0.52}Al_{0.48}As$ or InP. The shell region may comprise $In_{0.53}Ga_{0.47}As$.

The semiconductor shell region is preferably doped in the source shell region and drain shell region and undoped in the channel shell region. The semiconductor core region is preferably doped over the whole length of the nanowire, i.e. in source core region, drain core region and channel core region.

The heterostructure field effect transistor (FET) 1 further comprises a gate structure disposed (circumferentially) around the channel region 1002 of the semiconductor wire 2, the gate structure comprising a gate dielectric layer 4 disposed (circumferentially) around and in contact with the channel region 1002 and a gate layer 5 disposed (circumferentially) around and in contact with the gate dielectric layer 4.

FIGS. 2A,2B to FIG. 5 show a schematic representation of different steps for a method for manufacturing a heterostructure field effect transistor (FET) according to certain embodiments.

FIGS. 2A,2B to FIGS. 3A,3B show two different ways of providing a semiconductor core region 100 according to certain embodiments.

Figure 2A:
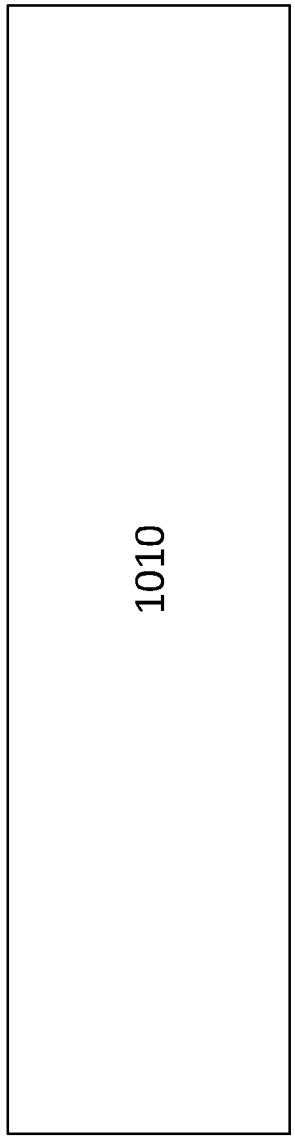
FIGS. 2A, 2B illustrate a schematic representation of different steps of a method for manufacturing a core region of a heterostructure field effect transistor (FET) according to an embodiment.
Figure 2B:
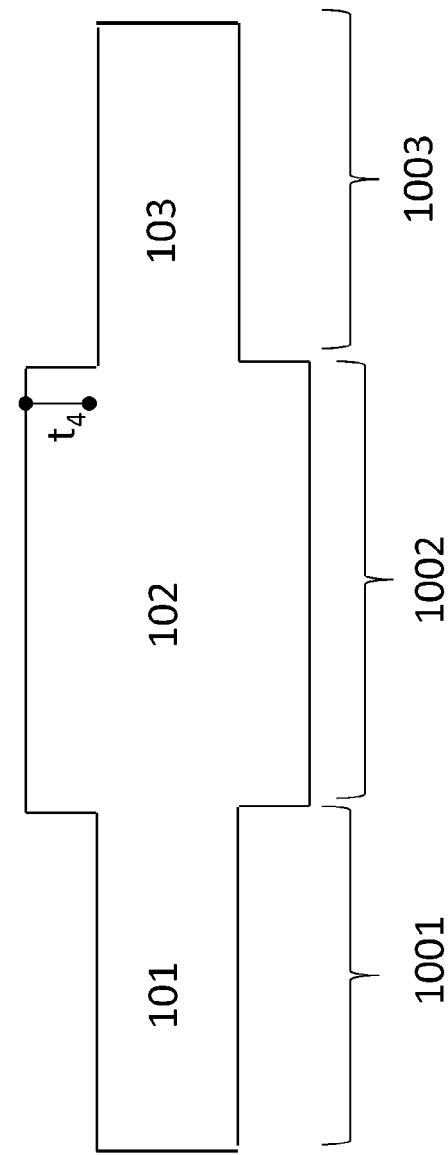

FIGS. 2A,2B show providing a semiconductor core region 100 by providing a uniform semiconductor core material 1010 and thereafter etching part of the semiconductor core material at the source core region 101 and drain core region 103.

Figure 3A:
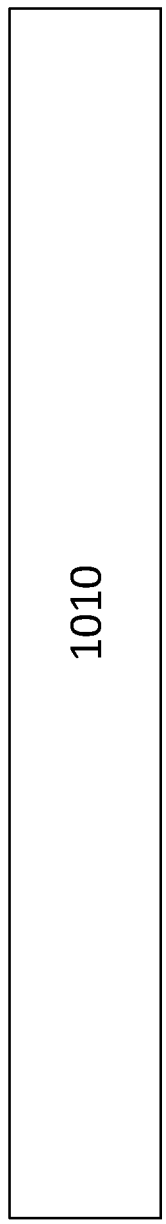
FIGS. 3A, 3B illustrate a schematic representation of different steps of a method for manufacturing a core region of a heterostructure field effect transistor (FET) according to another embodiment.
Figure 3B:
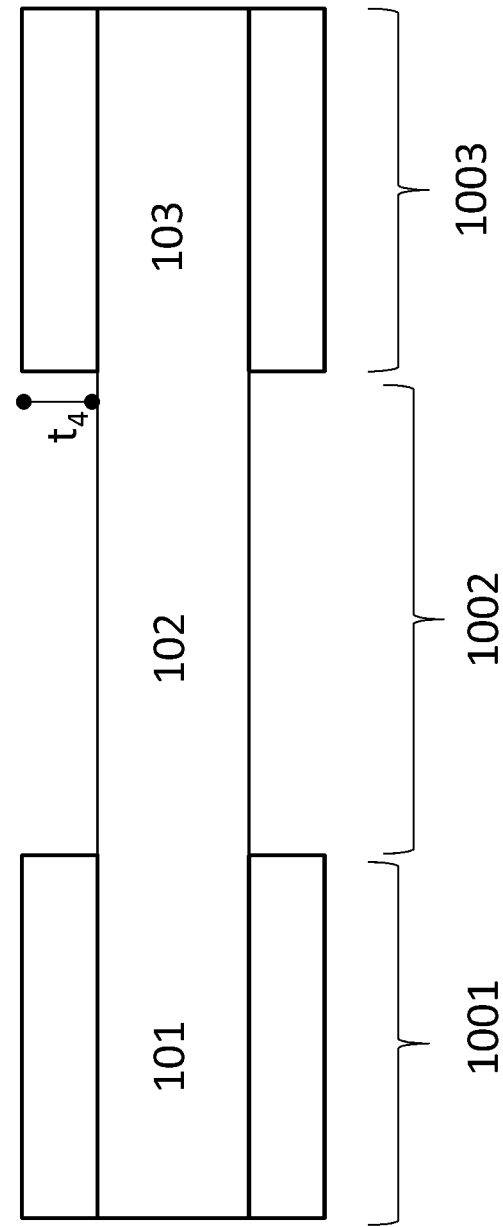

FIGS. 3A,3B show providing a semiconductor core region 100 by providing a uniform semiconductor core material 1010 and thereafter providing a hard mask layer on the uniform semiconductor core material 1010 at the source core region 101 and drain core region 103 thereby masking the outer parts of the semiconductor core region. Thereafter semiconductor core material (which is the same material as the uniform semiconductor core material 1010) is provided on the parts of the core region 100 which are unmasked, i.e. on the channel core region 102.

For both a thickness $t_4$ may be defined which is the difference in thickness or width (i.e. in the transversal direction T) between the outer surface of the channel core region 102 and the outer surface of the source core region 101 and/or drain core region 103.

After providing a semiconductor core region comprising a channel core region 102 located in between a source core region 101 and a drain core region 103, wherein the thickness of the source core region 101 and the drain core region 103 is smaller than the thickness of the channel core region 102; a semiconductor shell region 200 is provided (circumferentially) around and in contact with the core region 100, the semiconductor shell region 200 comprising a channel shell region 202 located in between a source shell region 201 and a drain shell region 203.

The material for the semiconductor shell region 200 may be lattice matched with the material for the semiconductor core region 100 to form a high quality quantum well structure.

Providing the semiconductor shell region 200 may be done in one or more steps.

Figure 4:
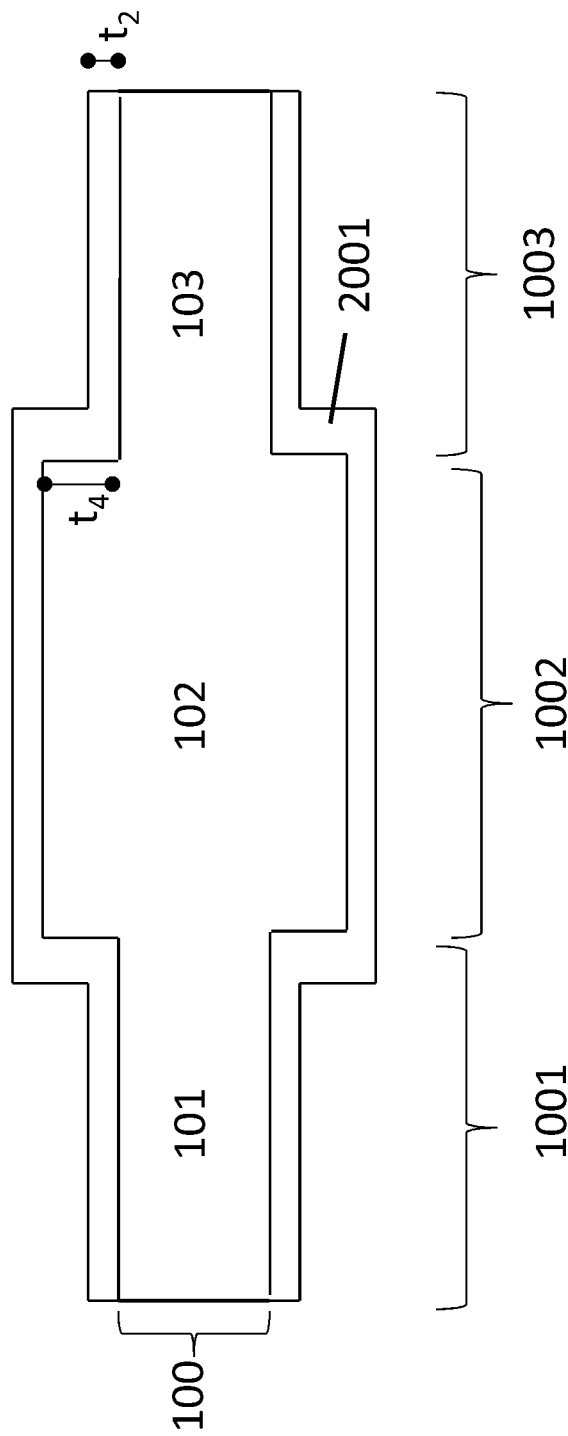
FIG. 4 illustrates a schematic representation of a first step of a method for manufacturing a shell of a heterostructure FET according to an embodiment.
Figure 6:
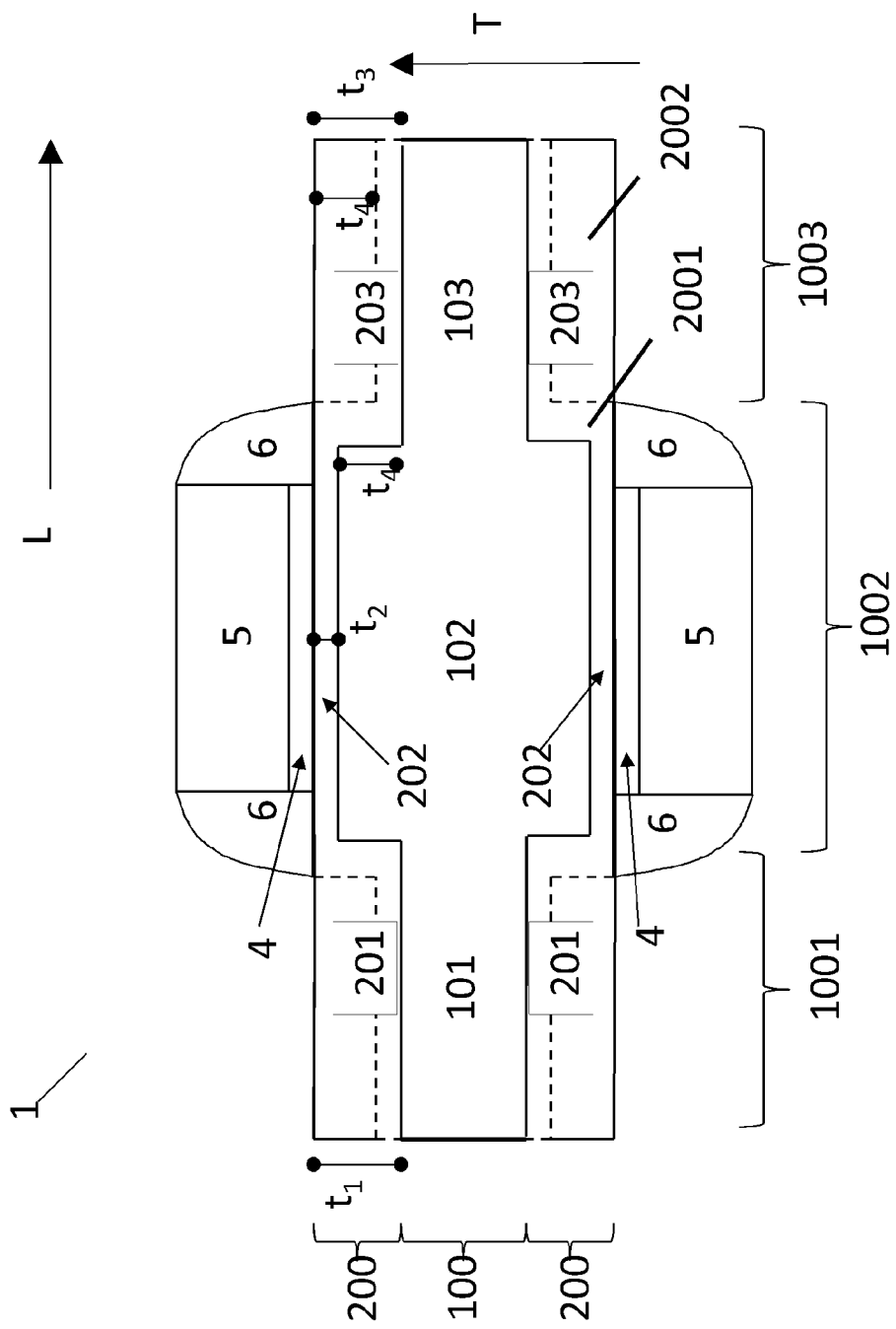
FIG. 6 illustrates a schematic representation of a third step of a method for manufacturing a shell of a heterostructure FET according to the embodiment illustrated in FIGS. 4 and 5.

In FIGS. 4 to 6 a possible embodiment is schematically shown for the step of providing the semiconductor shell region 200 around the semiconductor core region 100.

In a first step (FIG. 4) a layer of semiconductor shell material 2001 is provided on and/or around the semiconductor core region material. The layer 2001 is a conformal layer which follows the geometry of the semiconductor core region 100. This may be done by any technique known for a person skilled in the art such as for example epitaxial growth. In this step, the thickness of the formed layer 2001 will determine the thickness $t_2$ of semiconductor shell region 200.

Thereafter the remaining part 2002 of the semiconductor shell region 200 is formed by providing the same semiconductor shell material as from the layer of semiconductor shell material 2001 in the source shell regions 201 and drain shell regions 203. The step of providing this remaining part of semiconductor shell region 200 may be done before or after the step of providing the gate structure (see FIG. 6).

FIG. 5 shows schematically the step of providing the gate structure after providing the layer of semiconductor shell material 2001 and before the step of providing the remainder part 2002 of the semiconductor shell region.

The step of providing a gate structure comprises the steps of providing a gate dielectric layer 4 [circumferentially] around and in contact with the channel shell region 202 and providing a gate layer 5 disposed [circumferentially] around and in contact with the gate dielectric layer 4. Thereafter—as will be known to a person skilled in the art—also spacers 6 may be formed.

After the step of providing the gate structure, the remainder part 2002 of the semiconductor shell region may be provided by providing the semiconductor shell material using the gate structure as a mask as shown in FIG. 6.

The total width or thickness of the first layer of semiconductor shell material ($t_2$) and the remainder part of the semiconductor shell region ($t_4$) defines the thickness of the source shell region ($t_1$) and/or drain shell region ($t_3$).

In following steps source shell region 201 and/or drain shell region 203 is doped using techniques known by a person skilled in the art such (for example with Boron, Phosphorus, Arsenic, and the like.). Doping of the wire may also be done during the growth of the wire, for example during epitaxial growth of the wire. The channel shell region 202 may remain undoped.

It is an advantage of certain embodiments that a so-called core-modulated coaxial semiconductor wire or nanowire is provided comprising a conductive shell region grown on and/or around a buffer core region, such that the carriers are confined to a limited region near the gate oxide interface. In these embodiments, the core region of the semiconductor wire may be fully depleted and all the carriers may be located in the region where the gate induced electric field lines control the barrier efficiently.

It is an advantage of certain embodiments that by thinning the conduction channel (i.e. the channel shell region 202) below a predetermined thickness, the gate control may be boosted and transconductance may be increased and simultaneously the series resistance in the extension regions, being the source and/or drain regions, may be kept low.

Figure 8:
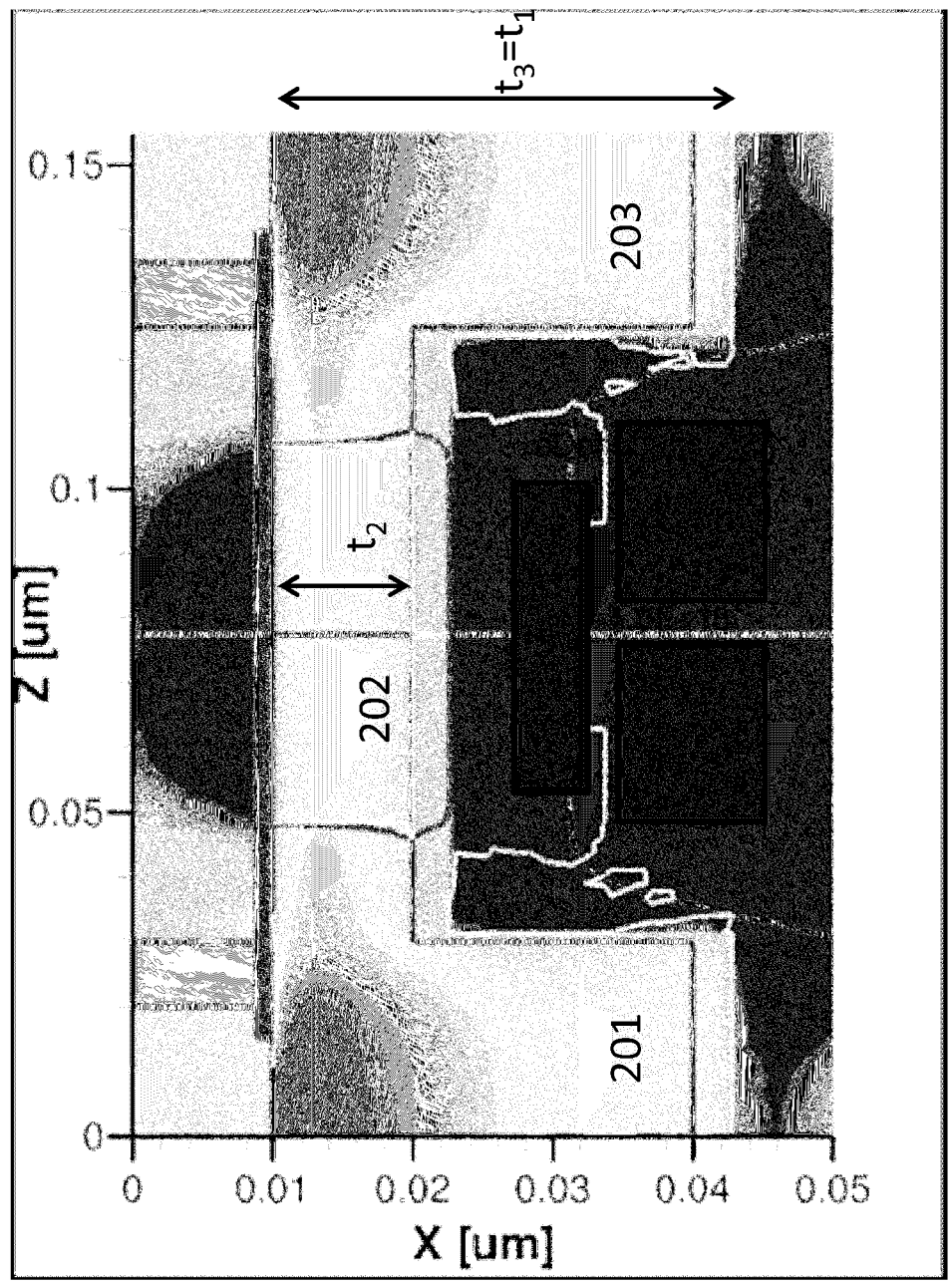
FIG. 8 shows a schematic representation of a heterostructure field effect transistor (FET) according to an embodiment superposed with the electron density profile within said heterostructure as simulated.

FIG. 8 shows the electron density profile along a FinFet channel simulated with the following parameters: Vds is 0; the gate overdrive is 0.3 V; the core is made of $In_{0.52}Al_{0.48}As$; the shell is made of $In_{0.53}Ga_{0.47}As$; $t_1$ and $t_3$ are each 30 nm; and $t_2$ is 10 nm. Three areas are indicated: 201, 202 and 203. The darkness within these areas is representative of the electron density therein. The lighter/white areas have an electron density around $1*10^{15}$ electrons/cm$^3$. The darker areas (dark gray) have an electron density around $1*10^{20}$ electrons/cm$^3$. As it can be clearly seen in this figure, the absence of dark regions within the channel shell region 202 (in contrast to the source shell region 201 and the drain shell region 203) means that the electron density is lower in this region and is relatively homogeneous throughout the channel. This is indicative of significant sub-band quantization in the channel shell region.

Figure 9:
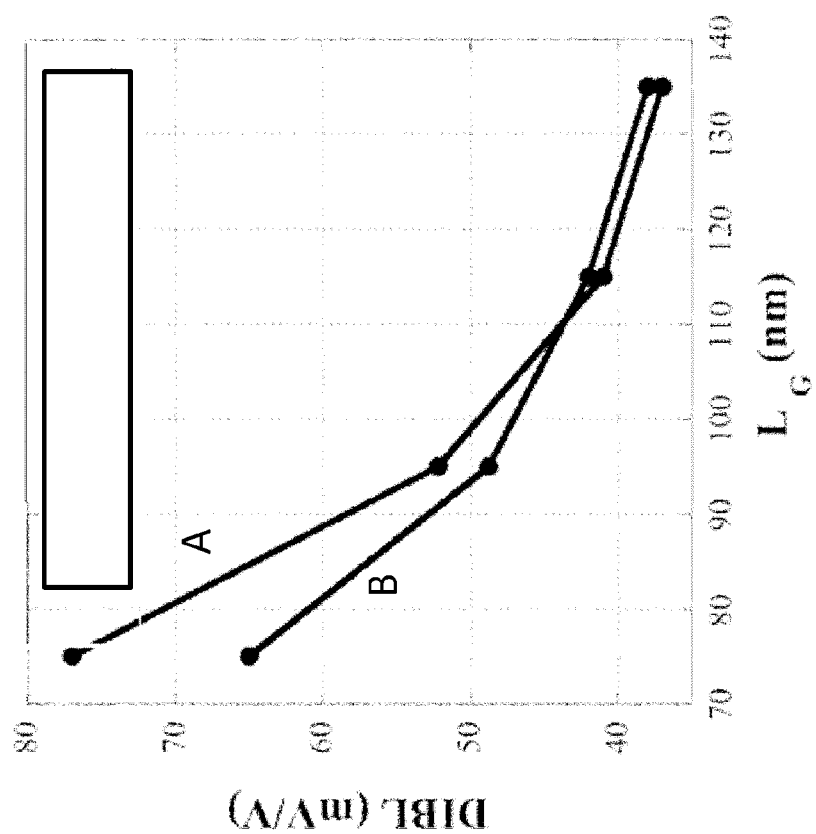
FIG. 9 shows the Drain Induced Barrier Lowering versus the channel length ($L_G$)

FIG. 9 confirms this by comparing the Drain Induced Barrier Lowering observed along the channel length ($L_G$) in a source-channel-drain system of uniform thickness ($t_1=t_2=t_3=30$ nm; curve A) with the Drain Induced Barrier Lowering observed along the channel length ($L_G$) in a source-channel-drain system of modulated thickness ($t_1=t_3=30$ nm; $t_2=10$ nm; curve B) of the embodiment of FIG. 8. Clearly, the DIBL is more uniform across the length of the embodiment of FIG. 8.

All references cited herein are incorporated herein by reference in their entirety. To the extent publications and patents or patent applications incorporated by reference contradict the disclosure contained in the specification, the specification is intended to supersede and/or take precedence over any such contradictory material.

Unless otherwise defined, all terms (including technical and scientific terms) are to be given their ordinary and customary meaning to a person of ordinary skill in the art, and are not to be limited to a special or customized meaning unless expressly so defined herein. It should be noted that the use of particular terminology when describing certain features or aspects of the disclosure should not be taken to imply that the terminology is being re-defined herein to be restricted to include any specific characteristics of the features or aspects of the disclosure with which that terminology is associated. Terms and phrases used in this application, and variations thereof, especially in the appended claims, unless otherwise expressly stated, should be construed as open ended as opposed to limiting. As examples of the foregoing, the term 'including' should be read to mean 'including, without limitation,' 'including but not limited to,' or the like; the term 'comprising' as used herein is synonymous with 'including,' 'containing,' or 'characterized by,' and is inclusive or open-ended and does not exclude additional, unrecited elements or method steps; the term 'having' should be interpreted as 'having at least;' the term 'includes' should be interpreted as 'includes but is not limited to;' the term 'example' is used to provide exemplary instances of the item in discussion, not an exhaustive or limiting list thereof; adjectives such as 'known', 'normal', 'standard', and terms of similar meaning should not be construed as limiting the item described to a given time period or to an item available as of a given time, but instead should be read to encompass known, normal, or standard technologies that may be available or known now or at any time in the future; and use of terms like 'preferably,' 'preferred,' 'desired,' or 'desirable,' and words of similar meaning should not be understood as implying that certain features are critical, essential, or even important to the structure or function of the invention, but instead as merely intended to highlight alternative or additional features that may or may not be utilized in a particular embodiment of the invention. Likewise, a group of items linked with the conjunction 'and' should not be read as requiring that each and every one of those items be present in the grouping, but rather should be read as 'and/or' unless expressly stated otherwise. Similarly, a group of items linked with the conjunction 'or' should not be read as requiring mutual exclusivity among that group, but rather should be read as 'and/or' unless expressly stated otherwise.

Where a range of values is provided, it is understood that the upper and lower limit, and each intervening value between the upper and lower limit of the range is encompassed within the embodiments.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity. The indefinite article "a" or "an" does not exclude a plurality. A single processor or other unit may fulfill the functions of several items recited in the claims. The mere fact that certain measures are recited in mutually different dependent claims does not indicate that a combination of these measures cannot be used to advantage. Any reference signs in the claims should not be construed as limiting the scope.

It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

All numbers expressing quantities of ingredients, reaction conditions, and so forth used in the specification are to be understood as being modified in all instances by the term 'about.' Accordingly, unless indicated to the contrary, the numerical parameters set forth herein are approximations that may vary depending upon the desired properties sought to be obtained. At the very least, and not as an attempt to limit the application of the doctrine of equivalents to the scope of any claims in any application claiming priority to the present application, each numerical parameter should be construed in light of the number of significant digits and ordinary rounding approaches.

Furthermore, although the foregoing has been described in some detail by way of illustrations and examples for purposes of clarity and understanding, it is apparent to those skilled in the art that certain changes and modifications may be practiced. Therefore, the description and examples should not be construed as limiting the scope of the invention to the specific embodiments and examples described herein, but rather to also cover all modification and alternatives coming with the true scope and spirit of the invention.

What is claimed is:

1. A heterostructure field effect transistor comprising:
   a semiconductor wire having a longitudinal direction and a transversal direction;
   a source region in the longitudinal direction of the semiconductor wire;
   a drain region in the longitudinal direction of the semiconductor wire;
   a channel region in between the source region and drain region and in the longitudinal direction of the semiconductor wire;
   a source core region in the transversal direction of the semiconductor wire;
   a source shell region disposed around the source core region, the source shell region having a thickness;
   a drain core region in the transversal direction of the semiconductor wire;
   a drain shell region disposed around the drain core region, the drain shell region having a thickness;
   a channel core region in the transversal direction of the semiconductor wire;
   a channel shell region disposed around the channel core region, the channel shell region having a thickness; and
   a gate structure disposed around the channel region, the gate structure comprising a gate dielectric layer disposed around and in contact with the channel region and a gate layer disposed around and in contact with the gate dielectric layer,
   wherein the thickness of the channel shell region is smaller than the thickness of the source shell region, wherein the thickness of the channel shell region is smaller than the thickness of the drain shell region, and wherein the source shell region, the drain shell region, and the channel shell region are each quantum well regions.

2. The heterostructure field effect transistor according to claim 1, wherein disposed around is disposed around circumferentially.

3. The heterostructure field effect transistor according to claim 1, wherein the thickness of the channel shell region is such that the channel shell region has a sub-band quantization energy greater than 4 kT.

4. The heterostructure field effect transistor according to claim 1, wherein a shell region, defined by the source shell region, the channel shell region, the drain shell region, and a core region, defined by the source core region, the channel core region, and drain core region, comprise lattice matched materials.

5. The heterostructure field effect transistor according to claim 1, wherein the core region comprises InP or $In_xAl_yAs$, wherein $x+y=1$.

6. The heterostructure field effect transistor according to claim 1, wherein the shell region comprises $In_xGa_yAs$, wherein $x+y=1$.

7. A method for manufacturing a heterostructure field effect transistor, comprising:
   providing a semiconductor core region comprising a channel core region located in between a source core region and a drain core region, wherein a thickness of the source core region and a thickness of the drain core region are both smaller than a thickness of the channel core region;
   providing a semiconductor shell region around and in contact with the semiconductor core region, the semiconductor shell region comprising a channel shell region, the channel shell region located in between a source shell region, wherein a thickness of the channel shell region is smaller than a thickness of the source shell region and a thickness of the drain shell region; and
   providing a gate structure by providing a gate dielectric layer around and in contact with the channel shell region and providing a gate layer disposed around and in contact with the gate dielectric layer, whereby the heterostructure field effect transistor according to claim 1 is obtained.

8. The method according to claim 7, wherein providing a semiconductor core region comprises providing a uniform semiconductor core material and etching part of the uniform semiconductor core material at the source core region and the drain core region.

9. The method according to claim 7, wherein providing a semiconductor core region comprises providing a uniform semiconductor core material, providing a hard mask layer on the uniform semiconductor core material at the source core region and drain core region, and providing the semiconductor core material on parts of the core region which are unmasked.

10. The method according to claim 7, wherein providing a semiconductor shell region comprises providing a first layer of semiconductor shell material around and in contact with the core region, and, providing a gate structure, providing a remainder part of the semiconductor shell layer around and in contact with the core region.

11. The method according to claim 7, wherein the core material and shell material are lattice matched.

12. The method according to claim 7, wherein the core material comprises InP or $In_xAl_yAs$, wherein $x+y=1$.

13. The method according to claim 7, wherein the shell material comprises $In_xGa_yAs$, wherein $x+y=1$.

14. The method according to claim 7, wherein a thickness of the first layer of semiconductor shell material is smaller than 4 nm.

* * * * *